(12) United States Patent
Jeong

(10) Patent No.: US 6,683,500 B2
(45) Date of Patent: Jan. 27, 2004

(54) AUTO BIAS CIRCUIT FOR POWER AMPLIFIER USING POWER MOSFET

(76) Inventor: Kwi-Sung Jeong, 762-85 1/1, Kwe-Jung 4, Saha-ku, Pusan (KR)

( * ) Notice: Subject to any disclaimer, the term of this patent is extended or adjusted under 35 U.S.C. 154(b) by 25 days.

(21) Appl. No.: 10/172,653

(22) Filed: Jun. 14, 2002

(65) Prior Publication Data

US 2002/0196084 A1 Dec. 26, 2002

(30) Foreign Application Priority Data

Jun. 22, 2001 (KR) ........................................ 2001-18863

(51) Int. Cl.[7] .............................. H03F 3/04; H03F 3/16; H03G 3/10
(52) U.S. Cl. ........................ 330/296; 330/285; 330/300
(58) Field of Search ................................. 330/285, 296, 330/300

(56) References Cited

U.S. PATENT DOCUMENTS

| | | | | |
|---|---|---|---|---|
| 4,403,198 A | * | 9/1983 | Muller | 330/264 |
| 4,550,359 A | * | 10/1985 | West | 361/56 |
| 5,313,381 A | * | 5/1994 | Balakrishnan | 363/147 |
| 5,554,954 A | * | 9/1996 | Takahashi | 327/546 |

* cited by examiner

Primary Examiner—Patricia Nguyen
(74) Attorney, Agent, or Firm—Jackson & Co., LLP; Kuni Oh

(57) ABSTRACT

The present invention relates to a power amplifier for use in audio equipment and the like, and more particularly to an auto bias circuit for a power amplifier using a power MOSFET, which can compensate for a drain current in the power amplifier using the power MOSFET.

The present invention provides an auto bias circuit for a power amplifier using a power MOSFET, comprising an emitter-grounded NPN type transistor having a collector connected to a DC source and to a gate of the power MOSFET, and a base connected to a source of the power MOSFET through a resistor for protecting the NPN type transistor and removing an AC component in cooperation with a capacitor; a smoothing capacitor of which one end is grounded and which is connected to the collector of the NPN type transistor; and an additional resistor of which one end is grounded and which is connected to the source of the power MOSFET and to the resistor for protecting the NPN type transistor and removing the AC component, thereby detecting a drain current.

According to the present invention, there is an advantage in that the drain current can be automatically compensated and thus an ideal operation of the power amplifier can be achieved. Further, there is another advantage in that high quality power amplifier can be mass-produced at a low cost.

2 Claims, 3 Drawing Sheets

AUTO BIAS CIRCUIT FOR POWER AMPLIFIER USING POWER MOSFET

BACKGROUND OF THE INVENTION

1. Field of Invention

The present invention relates to a power amplifier for use in audio equipment and the like, and more particularly to an auto bias circuit for a power amplifier using a power MOSFET, which can compensate for a drain current in the power amplifier using the power MOSFET.

2. Description of the Prior Art

Referring to FIG. 1, there is shown the configuration of a fixed bias circuit for a power amplifier using a power MOSFET.

The power MOSFET has extremely low input impedance for high frequency, due to its large input capacity. Therefore, an impedance conversion transformer T11 having a winding ratio of 2:1 (i.e., impedance ratio of 4:1) is used to provide low resistance of a signal source so as to drive the power MOSFET Q11.

The power MOSFET Q11 has a source to which a source resistor R16 is connected for enhancing stability of a DC bias current. The power MOSFET has a drain and a gate between which a negative feedback is provided.

Further, the negative feedback implements a broadband amplifier and a reduction of output impedance. Here, the provision of the negative feedback should be determined in consideration of both a bandwidth and a power gain. Furthermore, a slight broadbanded effect may be obtained by dividing feedback resistors and then connecting a capacitor C13 to a ground.

The power MOSFET, which is primarily used as a switching element, has very large forward transconductance, and thus, a single power MOSFET can be used as a practical power amplifier for audio equipment.

Such switching element can be used for the fixed bias in the same manner as the prior art. However, since characteristics of a semiconductor device greatly vary with change in temperature, temperature compensation is needed. Moreover, since the power MOSFET element has a very large value of transconductance gts, there is a large difference between characteristics of individual elements. If the power MOSFET element is used as the switching element, it does not cause any problems. However, if the power MOSFET element is used in the power amplifier for the audio equipment, individual adjustments should be made for each element. Therefore, there is a disadvantage in that the use of the fixed bias may remarkably degrade productivity of the power amplifier upon mass production thereof and increase production costs. Furthermore, there is a problem in that inconvenience is caused by the need for manual adjustment of a variable resistor VR11.

SUMMARY OF THE INVENTION

The present invention is conceived to solve the above problems. An object of the present invention is to provide an auto bias circuit for a power amplifier using a power MOSFET, which allows the power amplifier to always perform an ideal operation by automatically compensating for a drain current and to be mass-produced at high quality and low cost.

According to one aspect of the present invention for achieving the above object, there is provided an auto bias circuit for a power amplifier using a power MOSFET, comprising an emitter-grounded NPN type transistor having a collector connected to a DC source and to a gate of the power MOSFET, and a base connected to a source of the power MOSFET through a resistor for protecting the NPN type transistor and removing an AC component in cooperation with a capacitor; a smoothing capacitor of which one end is grounded and which is connected to the collector of the NPN type transistor; and an additional resistor of which one end is grounded and which is connected to the source of the power MOSFET and to the resistor for protecting the NPN type transistor and removing the AC component, thereby detecting a drain current.

According to another aspect of the present invention, there is provided an auto bias circuit for a power amplifier using a power MOSFET, comprising a PNP type transistor having a collector connected to a gate of the power MOSFET through a diode side of a photocoupler, a base connected to a drain of the power MOSFET through a resistor for protecting the PNP type transistor and removing an AC component in cooperation with a capacitor, and an emitter connected to a voltage source; a smoothing capacitor of which one end is grounded and which is connected to a collector of the photocoupler between a DC source and the gate of the power MOSFET; and an additional resistor of which one end is connected to the voltage source and which is connected to the drain of the power MOSFET, thereby detecting a drain current.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION

Hereinafter, an auto bias circuit for a power amplifier using a power MOSFET according to the present invention will be described in detail with reference to the accompanying drawings.

Figure 1:
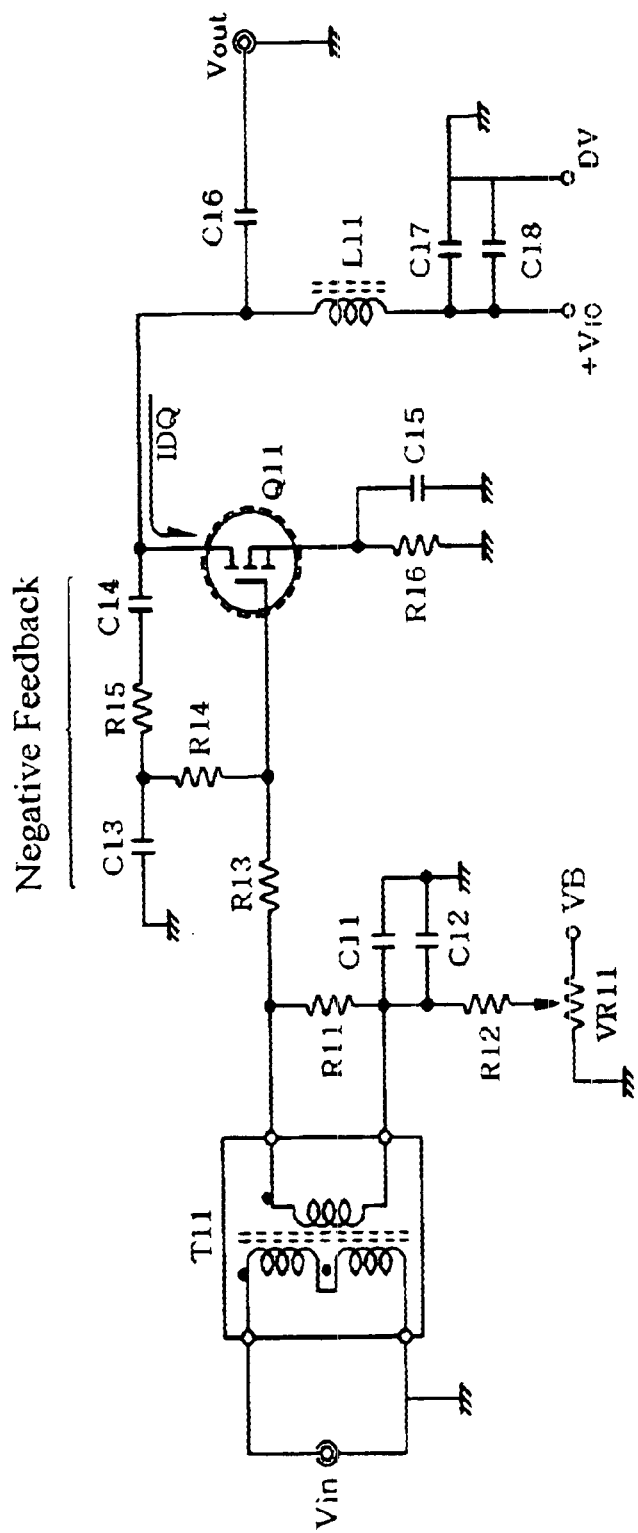
FIG. 1 is a circuit diagram showing the configuration of a fixed bias circuit for a conventional power amplifier.
Figure 2:
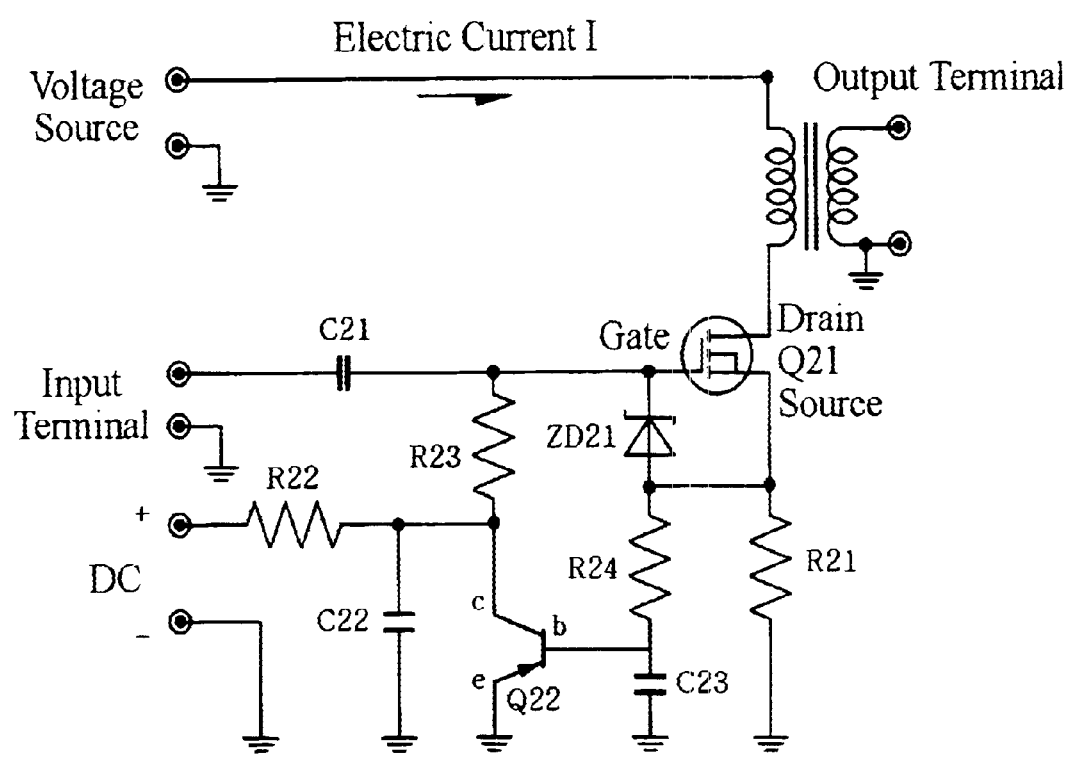
FIG. 2 is a circuit diagram showing the configuration of an auto bias circuit for a power amplifier using a power MOSFET according to one embodiment of the present invention.

FIG. 2 is a circuit diagram showing the configuration of an auto bias circuit for a power amplifier using a power MOSFET according to one embodiment of the present invention.

A power MOSFET Q21 used as a main component of the power amplifier has a source grounded through a resistor R21, a gate connected to an input terminal through a capacitor C21, and a drain connected to a voltage source and an output terminal through an impedance matching transformer T21. The configuration of a bias circuit for the above power MOSFET Q21 will be described below. Resistors R22, R23 connected to each other in series are provided between a DC source serving as a bias voltage source for the power MOSFET and the gate of the power MOSFET Q21. A junction between the resistors R22 and R23 is connected to a collector of an NPN type transistor Q22 and to a smoothing capacitor C22 of which one end is grounded. A base of the NPN type transistor Q22 and a capacitor C23 of which one end is grounded are connected through a resistor R24 to the source of the power MOSFET Q21. An emitter of the NPN type transistor Q22 is grounded, and a zener diode ZD21 is connected between the source and the gate of the power MOSFET Q21.

Although the N-channel MOSFET and the NPN type transistor are used in the embodiment, a P-channel MOSFET and a PNP type transistor may be employed therein. Furthermore, an operational amplifier may be employed instead of the NPN or PNP type transistor.

The resistor R24 for protecting the NPN type transistor Q22 constitutes a low pass filter, which serves to remove the AC component detected by the resistor R21, in cooperation with the capacitor C23.

If a voltage above a rated voltage is applied to between the source and gate of the power MOSFET Q21, the gate may be destructed. The zener diode ZD21 functions to prevent such destruction.

The voltage source may be a low voltage source or a high voltage source capable of supplying a high voltage of several hundred volts.

The operational principle of the present invention will be described in detail hereinafter with reference to FIG. 2.

An electric current I flows from the voltage source through the impedance matching transformer T21 and the power MOSFET Q21 into the resistor R21, whereby a voltage is developed across the resistor R21. The voltage developed across the resistor R21 is applied to the base of the NPN type transistor Q22 through the resistor R24 which functions to protect the NPN type transistor Q22 and, in cooperation with the capacitor C23, to remove the AC component detected by the resistor R21. The application of such voltage to the base of the NPN type transistor Q22 controls an electric current flowing into the collector of the NPN type transistor Q22. This causes a change in the voltage at the collector of the NPN type transistor Q22. The collector voltage thus changed controls the voltage at the gate of the power MOSFET Q21, which controls the voltage across the resistor R21 and thence the current I.

As the current I increases, the voltage applied to the base of the NPN type transistor Q22 is raised while the voltage at the collector of the NPN type transistor Q22 is lowered. Thus, the voltage for biasing the power MOSFET Q21 is lowered. This suppresses the increase in the current I. On the contrary, as the current I decreases, the voltage applied to the base of the NPN type transistor Q22 is lowered while the voltage at the collector of the NPN type transistor Q22 is raised. Thus, the voltage for biasing the power MOSFET Q21 is raised. This suppresses the decrease in the current I.

The above descriptions are limited to a DC operation. The present invention is also applicable to a radio frequency/audible frequency (hereinafter, referred to as "RF/AF") power amplifier. In this case, it is necessary to smooth an RF/AF signal inputted through the capacitor C21 by the smoothing capacitor C22 so that the inputted RF/AF signal dose not appear at the collector of the NPN type transistor Q22, and to allow the power amplifier to operate only with a DC bias.

Figure 3:
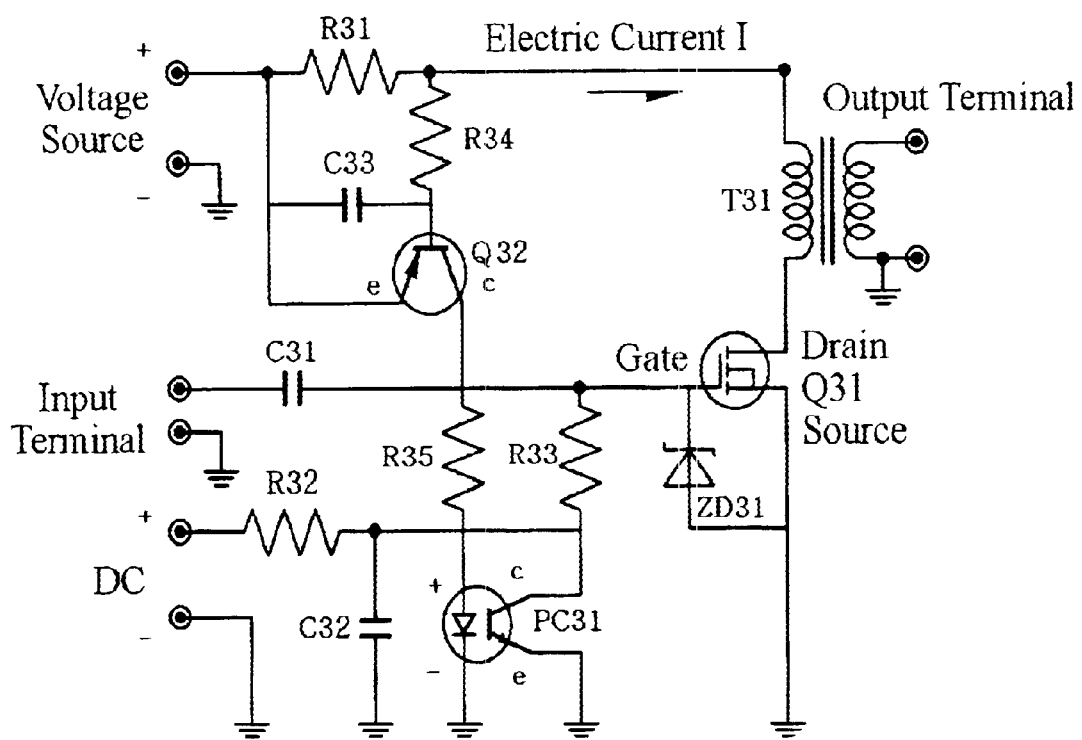
FIG. 3 is a circuit diagram showing the configuration of an auto bias circuit for a power amplifier using a power MOSFET according to another embodiment of the present invention.

FIG. 3 is a circuit diagram showing the configuration of an auto bias circuit for a power amplifier using a power MOSFET according to another embodiment of the present invention.

A power MOSFET Q31 used as a main component of a power amplifier has a grounded source, a gate connected to an input terminal through a capacitor C31, and a drain connected to a voltage source as a power supply for the power MOSFET Q31 through an impedance matching transformer T31 and a resistor R31. The configuration of a bias circuit for the power MOSFET Q31 will be described below. Resistors R32, R33 connected to each other in series are provided between a DC source serving as a bias voltage source for the MOSFET and the gate of the power MOSFET Q31. A junction between the resistors R32 and R33 is connected to a collector of a photocoupler PC31 and to a smoothing capacitor C32 of which one end is grounded. A base of a PNP type transistor Q32 and a capacitor C33 of which one end is connected to the voltage source are connected through a resistor R34 to a junction between a resistor R31 and the impedance matching transformer T31. An emitter of the PNP type transistor Q32 is connected to the voltage source and a collector thereof is connected through a resistor R35 to a diode side of the photocoupler PC31. A collector of the photocoupler PC31 is connected to both the gate of the power MOSFET Q31 and one end of a zener diode ZD31 through the resistor R33.

In this case, since there is a large difference in the voltages between the bias side and the detecting side (i.e., both ends of the resistor R31), the photocoupler PC31 is used for isolation thereof.

Although the N-channel MOSFET and the PNP type transistor are used in the embodiment, a P-channel type MOSFET and an NPN type transistor may be employed therein. Furthermore, an operational amplifier may be employed instead of the PNP or NPN type transistor.

The resistor R34 for protecting the PNP type transistor Q32 constitutes a low pass filter, which serves to remove an AC component detected by the resistor R31, in cooperation with the capacitor C33.

If a voltage above a rated voltage is applied to between the source and gate of the power MOSFET Q31, the gate may be destructed. The zener diode ZD31 functions to prevent such destruction.

The voltage source may be a low voltage source or a high voltage source capable of supplying a high voltage of several hundred volts.

The operational principle of the present invention will be described in detail hereinafter with reference to FIG. 3.

An electrical current I flows from the voltage source into the resistor R31, whereby a voltage is developed across the resistor R31. The voltage developed across the resistor R31 is applied to the base of the PNP type transistor Q32 through the resistor R34 which functions to protect the PNP type transistor Q32 and, in cooperation with the capacitor C33, to remove the AC component detected by the resistor R31. The application of such voltage to the base of the PNP type transistor Q32 controls an electric current flowing into the collector of the PNP type transistor Q32, whereby the quantity of light on the diode side of the photocoupler PC31 is controlled and thus a voltage at the collector of the photocoupler PC31 is also controlled. The collector voltage thus controlled controls a voltage at the gate of the power MOSFET Q31, which controls a voltage across the resistor R31 and thence a drain current I of the power MOSFET Q31.

As the current I increases, the voltage applied to the base of the PNP type transistor Q32 is raised while the current at the collector of the PNP type transistor Q32 increases. Thus, the quantity of light on the diode side of the photocoupler PC31 increases, and then, the voltage at the collector of the photocoupler PC31 is lowered. The lowered collector voltage is further lowered through the resistor R33 and thus the voltage at the gate of the power MOSFET Q31 is also lowered. This suppresses the increase in the current I. On the contrary, as the current I decreases, the voltage applied to the base of the PNP type transistor Q32 is lowered while the current at the collector of the PNP type transistor Q32 decrease. Therefore, the quantity of light on the diode side of the photocoupler PC31 decreases, whereby the voltage at the collector of the photocoupler PC31 is raised. The raised collector voltage is further raised through the resistor R33 and thus the voltage at the gate of the power MOSFET Q31 is also raised. This suppresses the decrease in the current I.

The above descriptions are limited to a DC operation. The present invention is also applicable to an RF/AF power amplifier. In this case, it is necessary to smooth an RF/AF signal inputted through the capacitor C31 by the smoothing capacitor C32 so that the inputted RF/AF signal dose not appear at a collector of a transistor side of the photocoupler PC31, and to allow the power amplifier to operate only with a DC bias.

The present invention is also applicable to a low frequency power amplifier, in addition to the RF/AF power amplifier.

Further, the auto bias circuit according to the present invention can be employed in all circuits using active elements that need a bias. For example, the present invention can be applied to audio equipment, high frequency transmitters, laser diodes, and the like.

As described above, with the auto bias circuit according to the present invention, the drain current can be automatically compensated and thus an ideal operation of the power amplifier can be achieved. Further, there is an advantage in that high quality products can be mass-produced at low cost.

Although the present invention has been described with respect to the preferred embodiments, it is not limited thereto. It can be understood by those skilled in the art that various changes and modifications can be made thereto without departing from the spirit and scope of the invention defined by the appended claims.

What is claimed is:

1. An auto bias circuit for a power amplifier using a power MOSFET, comprising:

an emitter-grounded NPN type transistor having a collector connected to a DC source and to a gate of the power MOSFET, and a base connected to a source of the power MOSFET through a resistor for protecting the NPN type transistor and removing an AC component in cooperation with a capacitor;

a smoothing capacitor of which one end is grounded and which is connected to the collector of the NPN type transistor; and an additional resistor of which one end is grounded and which is connected to the source of the power MOSFET and to the resistor for protecting the NPN type transistor and removing the AC component, thereby detecting a drain current.

2. An auto bias circuit for a power amplifier using a power MOSFET, comprising:

a PNP type transistor having a collector connected to a gate of the power MOSFET through a diode side of a photocoupler, a base connected to a drain of the power MOSFET through a resistor for protecting the PNP type transistor and removing an AC component in cooperation with a capacitor, and an emitter connected to a voltage source;

a smoothing capacitor of which one end is grounded and which is connected to a collector of the photocoupler between a DC source and the gate of the power MOSFET; and an additional resistor of which one end is connected to the voltage source and which is connected to the drain of the power MOSFET, thereby detecting a drain current.

* * * * *